United States Patent [19]
Nomiya et al.
[11] 3,840,757
[45] Oct. 8, 1974

[54] FLIP-FLOP CIRCUIT

[75] Inventors: Kosei Nomiya; Yoshikazu Hatsukano, both of Tokyo, Japan
[73] Assignee: Hitachi, Ltd., Tokyo, Japan

[22] Filed: Mar. 27, 1973
[21] Appl. No.: 345,476

[30] Foreign Application Priority Data
Mar. 27, 1972 Japan .............................. 47-29723

[52] U.S. Cl. .............................. 307/279, 307/247 R
[51] Int. Cl. .............................. H03k 3/286
[58] Field of Search .............................. 307/279, 247

[56] References Cited

UNITED STATES PATENTS

| | | | |
|---|---|---|---|
| 3,555,307 | 1/1971 | Hujita | 307/279 |
| 3,624,423 | 11/1971 | Borgini | 307/279 |
| 3,660,827 | 5/1972 | Tickle | 307/279 X |
| 3,714,471 | 1/1973 | Au | 307/279 |

*Primary Examiner*—John S. Heyman
*Attorney, Agent, or Firm*—Craig & Antonelli

[57] ABSTRACT

A static flip-flop circuit wherein an input terminal and an output terminal of a first inverter circuit are respectively feedback-connected to an output terminal and an input terminal of a second inverter circuit, complementary input signals are respectively applied to an input terminal of either one of the field-effect transistors connected in series between the input terminal of the first inverter circuit and ground and to an input terminal of either one of the field-effect transistors connected in series between said input terminal of the second inverter circuit and ground, the first pulse signal is applied to a field-effect transistor connected between an ouptut terminal of said flip-flop circuit and the output terminal of either one of the first and second inverter circuits, and the second pulse signal differing in phase from said first pulse signal is applied to an input electrode of the other of the field-effect transistors connected to the input terminal of the first inverter circuit and to an input electrode of the other of the field-effect transistors connected to the input terminal of the second inverter circuit.

5 Claims, 6 Drawing Figures

FLIP-FLOP CIRCUIT

BACKGROUND OF THE INVENTION

1. Field of the Invention

The present invention relates to a flip-flop circuit, and more particularly to a static flip-flop circuit employing insulated gate field-effect transistors.

2. Description of the Prior Art

Flip-flop circuits constituted of insulated gate field-effect transistors (IGFET's) are broadly classified into two types; the dynamic flip-flop circuit and the static flip-flop circuit. Although the former is simpler in construction, the latter is more preferable in some cases in view of its retentivity for information.

FIG. 1 shows an example of the dynamic flip-flop circuit which is generally used. Referring to the figure, $T_1$ – $T_6$ designate insulated gate field-effect transistors (hereinafter shortly termed the transistors). The transistor $T_1$ is connected through the transistor $T_2$ between a power source terminal ($-V_{DD}$) and ground, and has its gate electrode connected to an input terminal IN through the transistor $T_3$ receiving a clock signal $\phi_1$ as an input. The transistor $T_4$ is connected through the transistor $T_5$ between the power source terminal ($-V_{DD}$) and ground. The transistor $T_6$ is connected between the gate electrode of the transistor $T_4$ and the juncture of the transistors $T_1$ and $T_2$, and receives a clock signal $\phi_2$ as an input. An output terminal OUT is connected to the juncture between the transistors $T_4$ and $T_5$.

With such a construction, the pulse frequency of each of the clock signals $\phi_1$ and $\phi_2$ to be applied to the field-effect transistors $T_3$ and $T_6$, serving as transfer gates, is determined by the time constant between the gate capacity and the leakage resistance of the particular transistor, and requires a frequency exceeding a certain prescribed value. Accordingly, as the clock pulses $\phi_1$ and $\phi_2$, pulses regularly repeated are generally employed, and control signals with steady state portions cannot be adopted.

FIG. 2 shows an example of the static flip-flop circuit composed of field-effect transistors. The flip-flop circuit in the figure comprises a first inverter circuit constructed of transistors $T_{11}$ and $T_{12}$, a second inverter circuit constructed of transistors $T_{13}$ and $T_{14}$, a third inverter circuit constructed of transistors $T_{15}$ and $T_{16}$, and transistors $T_{17}$, $T_{18}$ and $T_{19}$ for transfer gates. The second inverter circuit and the third inverter circuit are connected in cascade. The output terminal of the third inverter circuit is connected for feedback through the transfer gate transistor $T_{18}$ to the input terminal of the second inverter circuit, and an information is retained by the feedback loop. The contents of the information retained within the above feedback loop depend on the state of the output of the first inverter circuit at the time when the transfer gate transistor $T_{17}$ is rendered conductive. A clock signal $\phi_2$ is applied to the gate electrodes of the transistors $T_{18}$ and $T_{19}$, while a clock control signal $\phi_{1,r}$ differing in phase from the clock signal $\phi_2$ is applied to the gate electrode of the transistor $T_{17}$.

The respective drain electrodes of the load transistors $T_{12}$, $T_{14}$ and $T_{16}$ are connected to receive a DC supply voltage $V_{DD}$, and the respective gate electrodes are connected to receive a DC supply voltage $V_{GG}$ which is higher than the DC supply voltage $V_{DD}$ by approximately the threshold voltage of the transistors.

Herein, voltages to be applied to the gate electrodes of the transfer gate transistors $T_{17}$, $T_{18}$ and $T_{19}$ require, on account of the well-known substrate effect, high voltage levels as in the load transistors $T_{12}$, $T_{14}$ and $T_{16}$, for example, the same level as the DC supply voltage $V_{GG}$. The substrate effect arises in such manner that, in the case where the substrates of the respective transistors are commonly connected to a reference potential source, for example, in an integrated semiconductor circuit, the respective transistors possess a single, common semiconductor substrate, voltages are exerted between the source electrodes of the transistors and the substrates thereof. The clock signal $\phi_2$ is therefore generated at a high voltage level by, for example, an astable multivibrator outside the integrated semiconductor circuit device.

On the other hand, the clock control signal $\phi_{1,r}$ is generated in such a way that a logic operation is performed between a clock signal $\phi_1$ (not used in the circuit of FIG. 1), similarly generated by an astable multivibrator or the like at a high voltage with a different phase from the clock signal $\phi_2$, and another pulse signal. The logic operation is performed by a logic circuit formed in the same way as the flip-flop circuit in the integrated semiconductor circuit in which the flip-flop circuit is constituted. The output potential of the clock control signal lowers to substantially the same potential as the DC supply voltage $V_{DD}$. In general, accordingly, level transformation is carried out in a circuit outside the integrated semiconductor circuit device in order to raise the output potential, and a clock control signal of high level is thus produced. It is also considered that the output level of the logic circuit is raised by adding one further power source in the identical integrated semiconductor circuit device. In any case, however, it is unavoidable to increase the number of external terminals of the integrated circuit device.

SUMMARY OF THE INVENTION

The principal object of the present invention is to provide a flip-flop circuit in which the writing or reading control for information can be made with a control signal of low level.

BRIEF DESCRIPTION OF THE DRAWINGS

FIG. 2 is a circuit diagram showing an example of a prior art static flip-flop circuit as already referred to;

PREFERRED EMBODIMENT OF THE INVENTION

The flip-flop circuit according to the present invention will be described in detail hereunder with reference to the accompanying drawings.

Figure 1:
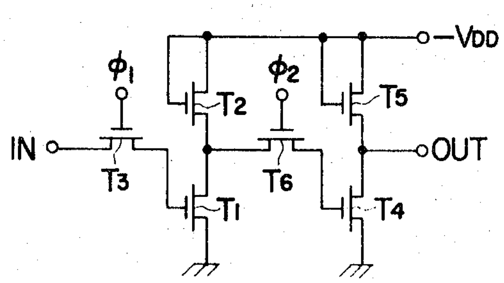
FIG. 1 PRIOR ART
FIG. 1 is a circuit diagram showing an example of a prior art dynamic flip-flop circuit as already described.
Figure 2:
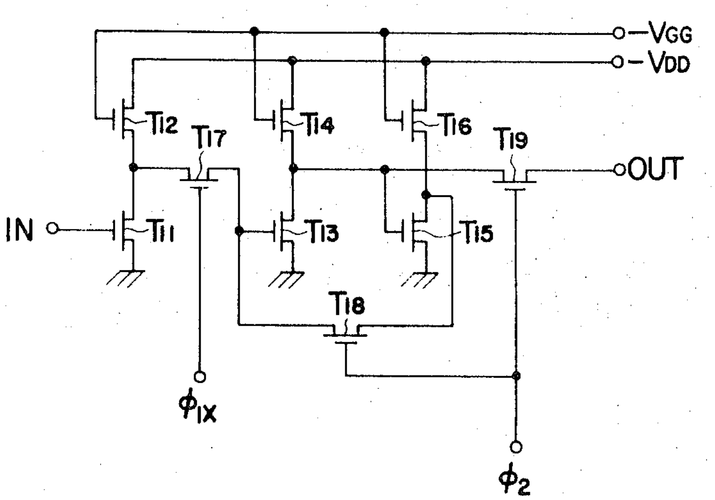
FIG. 2 PRIOR ART
Figure 3:
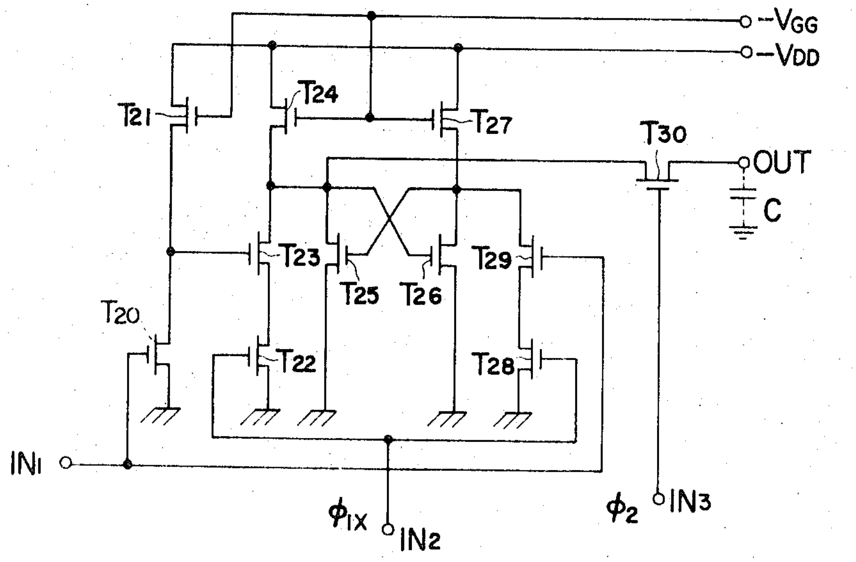
FIG. 3 is a circuit diagram showing an embodiment of a flip-flop circuit according to the present invention.

FIG. 3 illustrates an embodiment of the flip-flop circuit according to the present invention. In the figure, $IN_1$ indicates an input terminal to which an input signal is supplied; $IN_2$ is an input terminal to which a control signal $\phi_{1,r}$, as illustrated in FIG. 4(*c*), is supplied; and $IN_3$ is an input terminal to which a clock signal $\phi_2$, as illustrated in FIG. 4(*a*), differing in phase from the control signal $\phi_{1x}$, is supplied.

A transistor $T_{20}$ has its gate electrode connected to the input terminal $IN_1$. The transistor $T_{20}$ is connected between a power source terminal ($-V_{DD}$) and ground through a transistor $T_{21}$ which has its gate electrode connected to a power source terminal ($-V_{GG}$). A transistor $T_{22}$ has its gate electrode connected to the input terminal $IN_2$, and one of its output electrodes is grounded. A transistor $T_{23}$ has its gate electrode connected to the juncture of the transistors $T_{20}$ and and $T_{21}$, and one of its output electrodes is connected to the other output electrode of the transistor $T_{22}$. A transistor $T_{24}$ has its gate electrode connected to the power source terminal ($-V_{GG}$). The transistor $T_{24}$ is connected between the other output electrode of the transistor $T_{23}$ and the power source terminal ($-V_{DD}$). Shown at $T_{25}$ and $T_{26}$ are transistors each of which has one of its output electrodes grounded, which transistors are feedback-connected to each other; accordingly, the other output electrodes of the transistors $T_{25}$ and $T_{26}$ are cross-connected to the respective gate electrodes of the other transistor. A transistor $T_{27}$ has its gate electrode connected to the power source terminal ($-V_{GG}$). The transistor $T_{27}$ is connected between the other output electrode of the transistor $T_{26}$ and the power source terminal ($-V_{DD}$). A transistor $T_{28}$ has its gate electrode connected to the input terminal $IN_2$, and one of its output terminals is grounded. A transistor $T_{29}$ has its gate electrode connected to the input terminal $IN_1$. The transistor $T_{29}$ is connected between the gate electrode of the transistor $T_{25}$ and the other output electrode of the transistor $T_{28}$. A transistor $T_{30}$ has its gate electrode connected to the input terminal $IN_3$. The transistor $T_{30}$ is connected between the juncture of the other output electrodes of the transistors $T_{23}$ and $T_{25}$ and the output terminal OUT.

As the transistors $T_{20} - T_{30}$, insulated gate field-effect transistors are employed. The transistors $T_{21}$, $T_{24}$ and $T_{27}$ are loads, respectively. The transistors $T_{24}$ and $T_{25}$ and the transistors $T_{26}$ and $T_{27}$ constitute the first and second inverter circuits, respectively. The transistors $T_{23}$ and $T_{29}$ receive complementary input signals so as to prevent both of these transistors from being rendered conductive at the same time and the state of the flip-flop circuit from accordingly becoming indeterminate. The clock pulses $\phi_2$ have a period which is determined by the time constant among the gate capacity C of the next stage to be connected to the output terminal OUT, the leakage resistance of the transistor $T_{19}$, etc. In this case, the control signal $\phi_{1x}$ may have a voltage level exceeding approximately the threshold voltage $V_{th}$ ($V_{th} < V_{GG}$). Accordingly, the control signal $\phi_{1x}$ may be, for example, of the same value as the level of the input signal.

The transistors are made in, for example, an integrated semiconductor circuit, the semiconductor substrate of which is grounded.

With such a construction, when the transistors $T_{22}$ and $T_{28}$ are rendered conductive by the control signal $\phi_{1x}$, a new information is written in by the input signal supplied to the input terminal $IN_1$. The information is statically retained by the feedback circuit of the transistors $T_{24} - T_{27}$.

In this case, one output electrode of each of the transistors $T_{22}$ and $T_{28}$ to which the control signal $\phi_{1x}$ is supplied is grounded, and the source electrode of each transistor and the substrate are maintained at the same potential. In consequence, the problem of the substrate effect as previously stated is eliminated. The transistors $T_{22}$ and $T_{28}$ can be reliably driven by the control signal $\phi_{1x}$ of the low voltage.

Figures 4A, 4B, 4C:
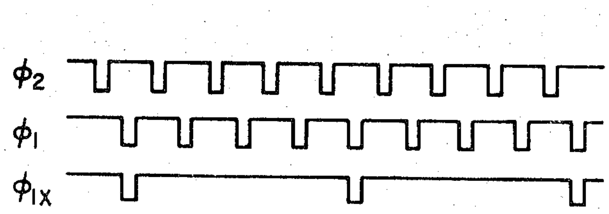
FIGS. 4*a* – 4*c* are waveform diagrams of pulses employed in the circuits of FIGS. 1 to 3.

Although, in the embodiment, the control signal $\phi_{1x}$ is supplied to the input terminal $IN_2$, the invention is not restricted thereto. By way of example, a clock signal $\phi_1$ may be supplied which, as illustrated in FIG. 4(b), differs in phase from the clock pulses $\phi_2$ and effects triggering regularly.

Although, in the embodiment, the output is taken out through the transistor $T_{30}$ from the output terminal of the first inverter circuit, namely, the juncture between the transistors $T_{24}$ and $T_{25}$, the invention is not restricted thereto. The output may also be taken out through the transistor $T_{30}$ from the output terminal of the second inverter circuit, namely, the juncture between the transistors $T_{26}$ and $T_{27}$.

Although, in the embodiment, the transistors $T_{22}$ and $T_{23}$ are transistors $T_{28}$ and $T_{29}$ are connected as shown in FIG. 3, the invention is not restricted thereto. It is also possible to connect the transistors $T_{22}$ and $T_{23}$ with the respective positions reversed, and to connect the transistors $T_{28}$ and $T_{29}$ with the respective positions reversed. That is to say, it is also possible to apply the complementary input signals to the transistors $T_{22}$ and $T_{28}$, and to apply the control signal $\phi_{1x}$ to the transistors $T_{23}$ and $T_{29}$. In this case, if the transistors on the ground side are non-conductive, the transistors on the load side need not be rendered conductive. If the transistors on the ground side are conductive, the source electrodes of the transistors on the load side fall to a potential approximately equal to ground potential. In either case, the substrate effect does not become a problem.

As described above, with the flip-flop circuit according to the present invention, the substrate effect is out of question as for the transistors to which the control signal is applied. The circuit is accordingly very advantageous in that the writing and reading control of information can be effected with the control signal of low level.

What is claimed is:

1. A flip-flop circuit comprising a first inverter circuit consisting of a first field-effect transistor in series with a first load, a second inverter circuit consisting of a second field-effect transistor in series with a second load, third and fourth field-effect transistors connected in series between an input terminal of said first inverter circuit and ground, fifth and sixth field-effect transistors connected in series between an input terminal of said second inverter circuit and ground, said input terminals and output terminals of said first and second inverter circuits being feedback-connected therebetween, first means for applying complementary first pulse signals respectively to an input electrode of one of said third and fourth field-effect transistors and an input electrode of one of said fifth and sixth field-effect transistors, a seventh field-effect transistor connected between an output terminal of said flip-flop circuit and an output terminal of one of said first and second inverter circuits and connected to receive a second pulse as an input, and second means for applying a first pulse signal different in phase from said second pulse signal to an input electrode of the other of said third and fourth field-effect transistors and an input electrode of the other of said fifth and sixth field-effect transistors.

2. A flip-flop circuit as defined in claim 1 wherein said first means includes an eighth field-effect transistor connected to the input electrode of said one of said third and fourth field-effect transistors and a source of said first pulse signals connected to the gate electrode of said eighth field-effect transistor.

3. A flip-flop circuit as defined in claim 1 wherein said first means includes an eighth field-effect transistor connected to the input electrode of said one of said fifth and sixth field-effect transistors and a source of said first pulse signals connected to the gate electrode of said eighth field-effect transistor.

4. A flip-flop circuit as defined in claim 1 wherein said first and second loads are provided as ninth and tenth field-effect transistors, respectively.

5. A flip-flop circuit as defined in claim 1 wherein said seventh field-effect transistor is connected to said first inverter circuit.

* * * * *